(12) United States Patent
Bueb et al.

(10) Patent No.: US 8,635,514 B2
(45) Date of Patent: Jan. 21, 2014

(54) ERROR CONTROL IN MEMORY STORAGE SYSTEMS

(75) Inventors: Christopher Bueb, Folsom, CA (US); Sean Eilert, Penryn, CA (US)

(73) Assignee: Micron Technology, Inc., Boise, ID (US)

(*) Notice: Subject to any disclaimer, the term of this patent is extended or adjusted under 35 U.S.C. 154(b) by 292 days.

(21) Appl. No.: 13/037,298

(22) Filed: Feb. 28, 2011

(65) Prior Publication Data
US 2012/0221917 A1 Aug. 30, 2012

(51) Int. Cl.
*H03M 13/00* (2006.01)

(52) U.S. Cl.
USPC .......................... 714/785; 714/784; 714/804

(58) Field of Classification Search
USPC ......... 714/785, 719, 784, 763, 768, 759, 804, 714/766
See application file for complete search history.

(56) References Cited

U.S. PATENT DOCUMENTS

| 5,226,043 | A | * | 7/1993 | Pughe et al. | 714/768 |
| 7,231,585 | B2 | * | 6/2007 | Vainsencher et al. | 714/784 |
| 7,296,213 | B2 | * | 11/2007 | Vainsencher et al. | 714/784 |
| 8,069,377 | B2 | * | 11/2011 | Singh | 714/711 |
| 2007/0297252 | A1 | * | 12/2007 | Singh | 365/200 |

* cited by examiner

*Primary Examiner* — Fritz Alphonse
(74) *Attorney, Agent, or Firm* — Dorsey & Whitney LLP

(57) ABSTRACT

A method includes calculating a first syndrome of a codeword read from a memory location under a first set of conditions and calculating a second syndrome of the codeword read from the memory location under a second set of conditions. The method also includes analyzing the first and second syndromes and applying one of the first and second syndromes to the codeword to find the codeword having a minimum number of errors.

27 Claims, 12 Drawing Sheets

ERROR CONTROL IN MEMORY STORAGE SYSTEMS

FIELD

The present invention relates generally to memory storage systems, and more specifically, to error control in memory storage systems.

BACKGROUND

In many memory storage systems and devices available today, phenomena such as random telegraph noise, voltage transients, electromagnetic interference, and other disturbances can jeopardize the integrity of stored data. Consequently, data words to be stored in storage systems may be encoded using an error control code so that these disturbances do not render the stored data unusable when accessed. Depending on the strength of the error control code, errors may be detected and corrected, or may only be detected. If errors are detected but cannot be corrected, then integrity of stored data is lost.

BRIEF DESCRIPTION OF THE DRAWINGS

Embodiments of the invention are illustrated by way of example and not limitation in the figures of the accompanying drawings, in which.

DESCRIPTION OF EMBODIMENTS

Figure 1:
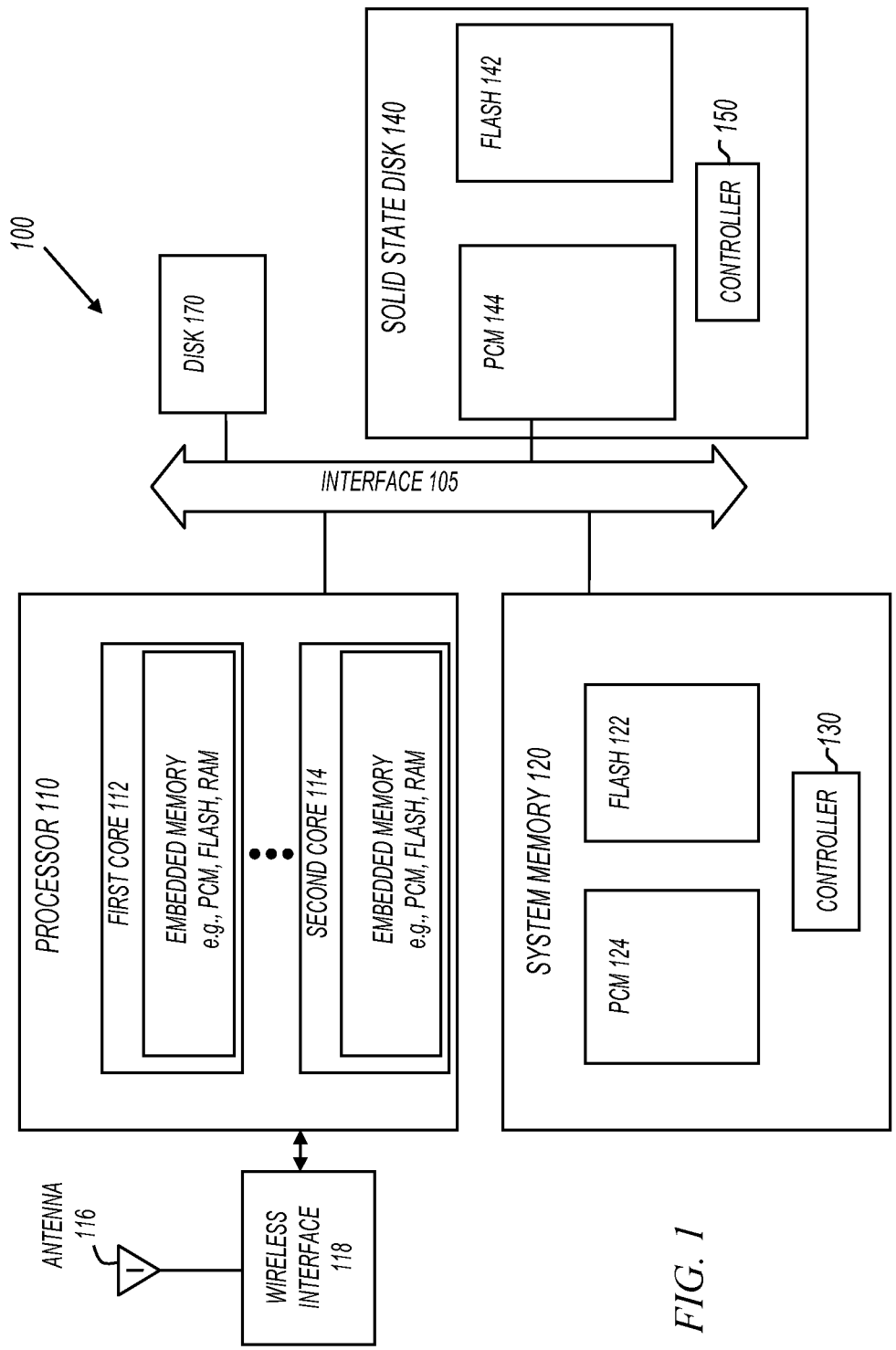
FIG. 1 shows an electronic system in accordance with various embodiments of the invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification, discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or the apparatus may comprise a general purpose computing device selectively activated or reconfigured by a computer program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), non-volatile memories such as electrically programmable read-only memories (EPROMs), electrically erasable and programmable read only memories (EEPROMs), or FLASH memories, or any other type of media suitable for storing electronic instructions, and capable of being coupled to a system bus for a computing device.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g. as in a cause an effect relationship).

FIG. 1 shows a system 100 in accordance with various embodiments of the present invention. System 100 may be any type of device that includes memory without departing from the scope of the present invention. For example, system 100 may be a computer or a mobile phone with nonvolatile memory. In another example, system 100 may be a global positioning system (GPS) receiver or a portable media player having nonvolatile memory.

In embodiments represented by FIG. 1, system 100 includes a wireless interface 118 coupled to antenna 116 to allow system 100 to communicate with other devices that also communicate over-the-air. As such, system 100 may operate as a cellular device or a device that operates in wireless networks such as, for example, Wireless Local Area Networks (WLANs), WiMax and Mobile WiMax based systems, Wideband Code Division Multiple Access (WCDMA), and Global System for Mobile Communications (GSM) networks, any of which may or may not operate in accordance with one or more standards. The various embodiments of the invention are not limited to operate in the above-identified network types; this is simply a list of examples. It should be understood that the scope of the present invention is not limited by the types of, the number of, or the frequency of the communication protocols that may be used by system 100. Embodiments are not, however, limited to wireless communication embodiments. Other non-wireless applications can make use of the various embodiments of the invention.

In some embodiments, wireless interface 118 may include one or more stand-alone Radio Frequency (RF) discrete or integrated analog circuits. In other embodiments, wireless interface 118 may be embedded within an integrated circuit that includes other components. For example, in some embodiments, wireless interface 118 may be included on a common integrated circuit with processor 110.

Processor 110 includes at least first core 112 and in some embodiments includes second core 114, and each core may include memory. For example, first core 112 may include volatile or nonvolatile memory, such as PCM, FLASH, RAM, and so forth. Each core may include any combination of different types of memory without departing from the scope of the present invention. Processor 110 may execute instructions from any suitable memory within system 100. For example, any memory within a processor core, or any of the memory devices within system memory 120, may be considered a computer-readable medium that has instructions stored that when accessed cause processor 110 to perform according to embodiments of the invention.

First core 112 and second core 114 may also make use of Magnetic Random Access Memory (MRAM), which employs magnetic storage elements formed from two ferromagnetic plates located at an intersection of a row and column line and selected by a Magnetic Tunnel Junction (MTJ) device. Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

First core 112 and the second core 114 may also make use of Ferro-electric Random Access Memory (FRAM), which employs memory cells that may include one transistor and one capacitor. The capacitor includes ferroelectric material and a bi-stable atom in the ferroelectric material that is shifted to form two stable polarization states. Memory cell data may be written by positively or negatively orienting the dipoles of the ferroelectric material via an applied polarizing voltage. Data may be read by detecting the voltage of the bit line (BL) connected with the memory cell. Current feed circuits supply electric currents to the bit lines for a predetermined period from a start of a read operation, and read control circuitry senses the direction of the electric polarization as either a high or a low logic state. Each orientation is stable and remains in place even after the electric field is removed, preserving the data within the memory without periodic refresh.

Processor 110 is shown coupled to interface 105. Interface 105 provides communication between processor 110 and the various other devices coupled to interface 105. For example, processor 110 may communicate with memory devices in system memory 120, solid state disk (SSD) 140, as well as disk 170. Interface 105 can include serial and/or parallel buses to share information along with control signal lines to be used to provide handshaking between processor 110 and the various other devices coupled to interface 105.

In some embodiments of the invention, system 100 may not include disk 170. For example, in some mobile phone embodiments, disk 170 may not be present. However, in other embodiments of the invention, such as computer-based applications, disk 170 may be included.

System memory 120 includes FLASH memory 122 and PCM 124 operating under the control of controller 130. Controller 130 may be any type of controller, including a microcontroller, a microprocessor, or the like. FLASH memory 122 stores information by storing charge on a floating gate in a Metal Oxide Semiconductor (MOS) transistor. The stored charge alters the threshold voltage of the transistor, and the difference in threshold voltage is "read" to determine whether the stored information is a "0" or a "1". In some embodiments, varying amounts of charge are stored on the floating gate to represent more than one binary digit of information per memory cell. This is sometimes referred to as Multi-Level Cell (MLC) FLASH. FLASH memory 122 may be any type of FLASH memory, including NOR FLASH memory, NAND single level cell (SLC) memory, or NAND multi-level cell (MLC) memory.

As previously mentioned, system memory 120 may also include PCM 124. A PCM is a memory that stores information based on modifiable material properties, such as whether a material is in a crystalline or an amorphous state (phase). For example, in some embodiments, phase change memories include alloys of elements of group VI of the periodic table, such as Te or Se, that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Phase change memory may be referred to as a Phase Change Memory (PCM), Phase-Change Random Access Memory (PRAM or PCRAM), Ovonic Unified Memory (OUM), Chalcogenide Random Access Memory (C-RAM), or by other suitable names.

Memory devices within system memory 120 may be packaged in any manner. For example, in some embodiments, FLASH memory 122 and PCM 124 may be combined in a stacking process to reduce the footprint on a board, packaged separately, or placed in a multi-chip package with the memory component placed on top of the processor. Further, in some embodiments, system memory 120 only includes FLASH memory 122 or only includes PCM 124. In still further embodiments, system memory 120 only includes a different type of memory (e.g., MRAM, FRAM).

Solid state disk (SSD) 140 is shown including FLASH memory 142, PCM 144, and controller 150. In some embodiments, SSD 140 only includes FLASH memory 142 or only includes PCM 144. In still further embodiments, SSD 140 only includes a different type of memory (e.g., MRAM, FRAM). Controller 150 may be any type of controller, including a microcontroller, a microprocessor, or the like. SSD 140 emulates the operation of a hard disk. For example, in some embodiments, SSD 140 may appear to the rest of the system as a FAT (file allocation table) formatted hard drive.

In operation, SSD 140 receives read and/or write requests. The read requests are satisfied by reading contents from FLASH memory 142 and/or from PCM 144, and the write requests are satisfied by writing to FLASH memory 142 and/or to PCM 144. Although not shown in FIG. 1, a translation layer may be used within SSD 140 to map logical addresses in the read and write requests to physical addresses in FLASH memory 142 and PCM 144. In some embodiments, the logical addresses include sector numbers and the physical addresses include blocks within the FLASH memory.

In various embodiments of the invention, one or more of memory controllers 130 and 150 have the capability to perform "secondary data extraction" from one or more memory devices in order to correct errors in lieu of (or in addition to) using conventional error correction codes, and applying the error detection (or error detection and correction) at the system level. For example, a memory controller may apply error correction coding to large data words that are "striped" across multiple memory devices (e.g., a disk sector's worth of data in SSD 140). If errors are detected, then the controller may retrieve additional information from the individual memory devices to better determine the source of errors, and possibly make changes that will increase the likelihood of reducing data errors.

Various memory device embodiments also include the ability to provide secondary data extraction. The secondary data may include syndrome values from error correction circuits, data values read using different sense amplifier reference values, or the like. In some embodiments, memory devices include microcontrollers that can be commanded to perform functions based in part on secondary data, and report the results back to a memory controller. Secondary data extraction, the use of secondary data, and memory devices that support secondary data extraction are further described below with reference to the remaining figures.

Figure 2:
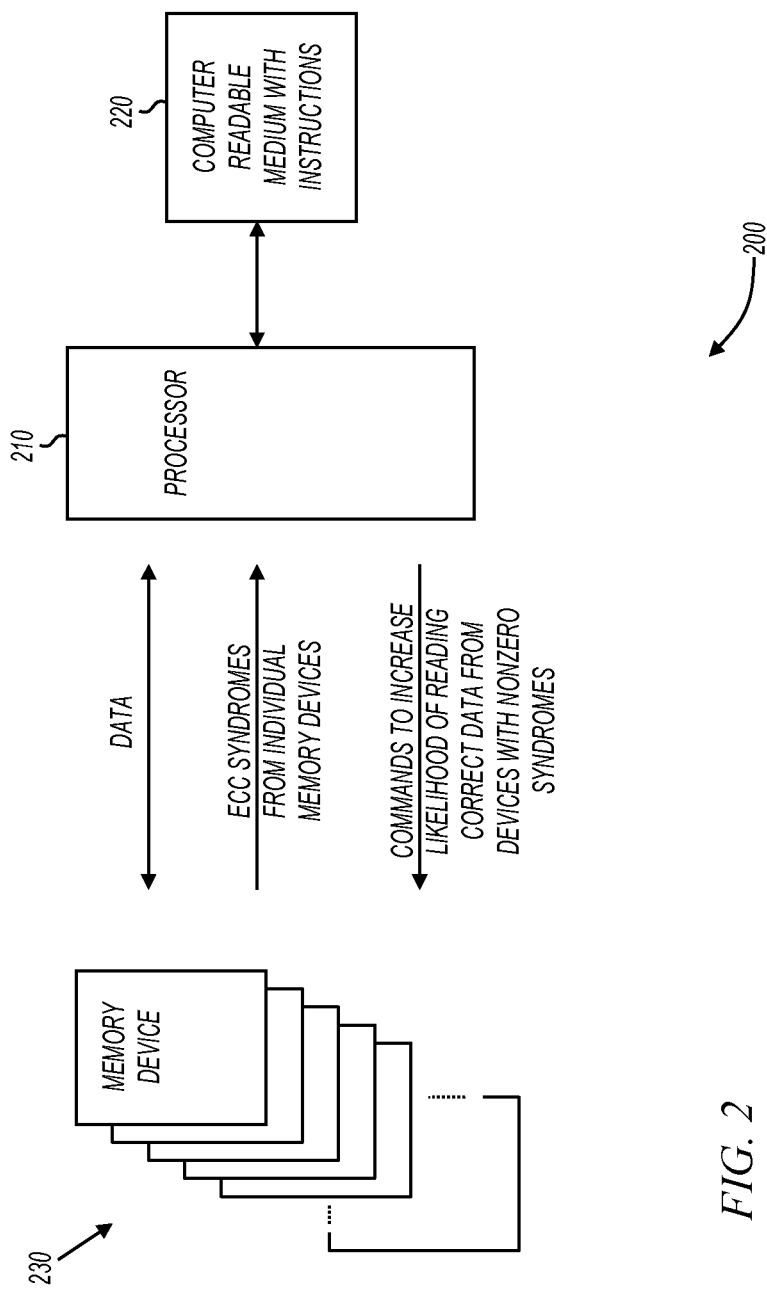
FIG. 2 shows a memory storage system that includes multiple memory devices.

FIG. 2 shows a memory storage system that includes multiple memory devices. System 200 may be any type of memory system, including for example, system memory 120, SSD 140, or memory within cores 112, 114 (FIG. 1). Memory devices 230 may include any type of memory, volatile or nonvolatile, including for example, FLASH, PCM, MRAM, FRAM, SRAM, and others. Processor 210 may be any type of processor, including a memory controller such as controller 130 or controller 150 (FIG. 1), or a processing core such as core 112 or core 114. Computer readable medium with instructions 220 provides storage for instructions to be executed by processor 210. Computer readable medium 220 may be any suitable medium including volatile or nonvolatile memory.

In operation, processor 210 stores and retrieves data in memory devices 230. In some embodiments, blocks of data are stored across more than one of memory devices 230. For example, in solid state disk embodiments, large blocks of data may be "striped" across multiple memory devices in a manner that results in a portion of the data being stored in each memory device. The large blocks of data may be coded for error detection (or error detection and correction). For example, parity bits may be computed and stored, cyclic redundancy check (CRC) values may be computed and stored, or block codes may be employed.

Depending on the strength of error control coding and the number of errors present, processor 210 may or may not be able to correct all errors. Further, processor 210 may be able to correct all errors, while at the same time being aware that the number of correctable errors is approaching a limit.

In some embodiments, memory devices 230 include their own internal error correction capability. In these embodiments, processor 210 may be able to read ECC syndromes from individual memory devices. An ECC syndrome results from comparing codewords generated before and after storing data in the memory device. In some embodiments, the syndrome identifies bit locations that are in error.

Processor 210 supplies commands to one or more of memory devices 230 to increase the likelihood of reading correct data. For example, in some embodiments, processor 210 may read a syndrome value from a memory device and then modify one or more parameters within the memory device (e.g., sense amplifier reference values or read window times). Also for example, processor 210 may send a command to a memory device that causes the memory device to autonomously modify one or more parameters within the memory device. Many different actions may be taken based on the results of these commands. For example, a portion of a memory device may be rewritten, a portion may be flagged as bad, or a sense amplifier reference value or read window time may be permanently changed.

Figure 3:
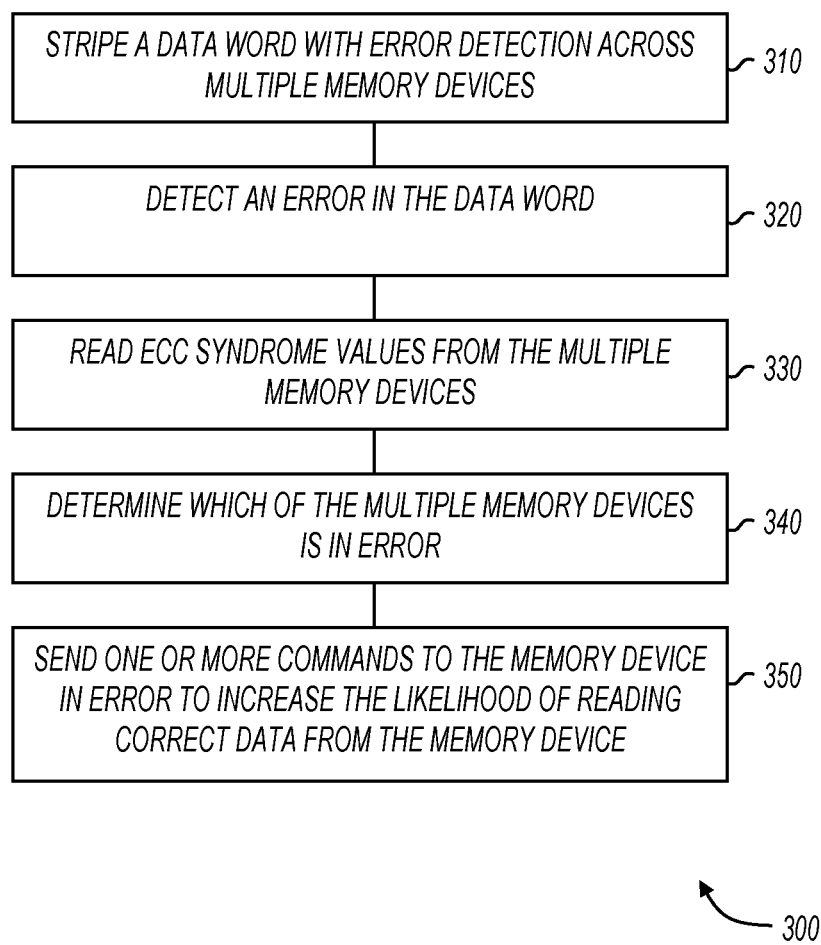
FIG. 3 shows a flow diagram for a method in accordance with various embodiments of the invention.

FIG. 3 shows a flow diagram of a method in accordance with various embodiments of the present invention. Method 300 may be performed by a memory system, a memory controller in a memory system, a processor, or the like. Examples include memory controllers 130, 150, cores 112, 114, and processor 210. Method 300 is not limited by the type or location of the apparatus performing the method.

Method 300 begins at 310 in which a data word with error detection is striped across multiple memory devices. For example, a single data word may be stored across memory devices 230 (FIG. 2) by processor 210. An example of a data word with error detection is a disk sector of data and a checksum. Another example is a large codeword resulting from data being coded by an error correction coding circuit. In some embodiments, the data word of 310 is coded only for error detection, and in other embodiments, the data word of 310 is coded for error detection and correction.

At 320, an error in the data word is detected. This may be accomplished in any manner. For example, in some embodiments, a processor may read the data word from the multiple memory devices, and compare parity bits or checksum values. The parity value or checksum value may not match, indicating an error. At this point, the processor has information indicating an error in one or more of the multiple memory devices, but does not know which device or what portion of which device is in error.

At 330, the processor reads ECC syndrome values from the multiple memory devices. Referring back to FIG. 2, this corresponds to processor 210 reading syndrome values from one or more of memory devices 230. The ECC syndrome values indicate whether or not each device has an error. The error may be correctable or non-correctable. Reading the ECC syndrome from the memory devices enables system level algorithms to gain insight into the action of the on-chip ECC engines in the various memory devices. This information may be used in many different ways, including identifying devices that may be miscorrecting errors, identifying "weak" devices that will fail soon or which may benefit from a data refresh.

At 340, the processor determines which of the multiple memory devices is in error from the ECC syndrome values, and at 350, the processor sends one or more commands to the memory device in error to increase the likelihood of reading correct data from the memory device.

In some embodiments, commands sent to the memory device instruct the memory device to make changes that increase the likelihood of correcting errors in the existing data word. Examples include temporarily changing sense amplifier reference values or read window times. In other embodiments, commands are sent that reduce the likelihood of future errors. Examples include commanding a memory device to permanently change a sense amplifier reference value or read time window, or to mark a portion of the device as bad.

In some embodiments, the device performing method 300 may control all aspects of changes made within the memory device. For example, in some embodiments, the device performing method 300 may send a command to change a sense amplifier reference value, and then send another command to cause the memory device to perform another read operation using the new sense amplifier reference value. In other embodiments, the device performing method 300 may send one command to a memory device, and the memory device may autonomously perform further functions to increase the likelihood of reducing further errors. For example, the memory device may include a microcontroller that performs multiple reads using different sense amplifier reference values, or that performs multiple reads using different read window times.

Figure 4:
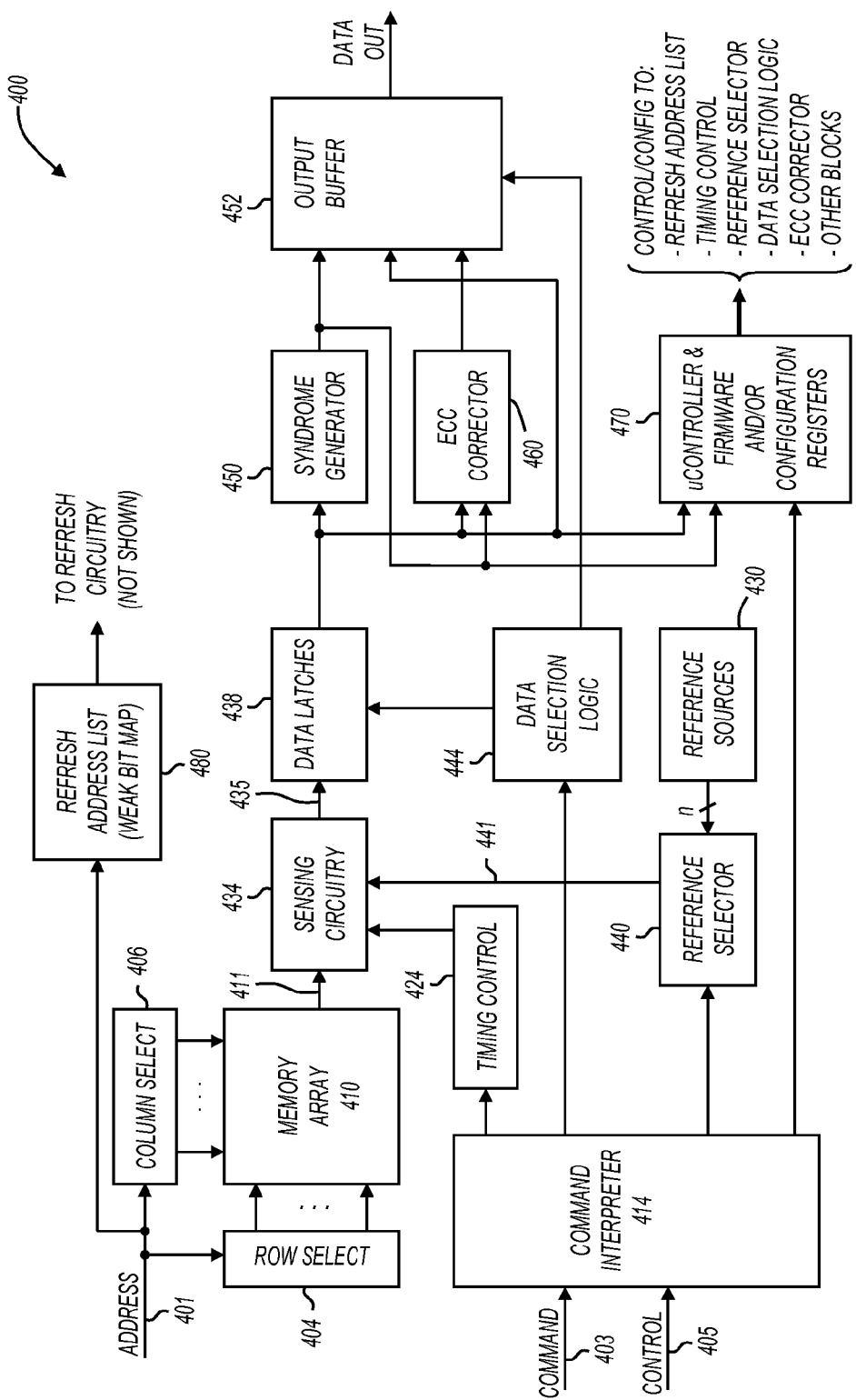
FIG. 4 shows a memory device with error control measures in accordance with various embodiments of the invention.

FIG. 4 shows a memory device with error control measures in accordance with various embodiments of the invention. Memory device 400 may be one of memory devices 230 (FIG. 2), and may provide ECC syndrome values and accept commands to increase the likelihood of reading correct data as described above with reference to FIG. 3. Further, memory device 400 may include any type of volatile or nonvolatile memory or any combination of different types of memory (e.g., FLASH, PCM, MRAM, FRAM, SRAM, DRAM).

Memory device 400 includes memory array 410, column select circuit 406, row select circuit 404, sensing circuitry 434, and data latches 438. In operation, data stored in memory array 410 is read when an address value on node 401 is presented to column select circuit 406 and row select circuit 404. By operation of column and row selection within memory array 410, stored values from a selected location within memory array 410 are presented to sensing circuitry 434 on node 411. Sensing circuitry 434 senses the stored values as either 1 or 0 and presents those values on node 435 to data latches 438. Data latches 438 then latch the data so that it can be read or further operated on. The diagram of FIG. 4 accentuates the "read path" within memory device 400, and intentionally omits components and data paths useful for other purposes (e.g., the "write path"). This intentional simplification of FIG. 4 maintains clarity in the diagram. One skilled in the art will understand that memory device 400 may include many more components than those explicitly shown in FIG. 4.

Memory device 400 also includes syndrome generator 450, error control code (ECC) corrector 460, and output buffer 452. In operation, data stored in memory array 410 has an error control code applied prior to writing in the array. Example coding techniques may include Hamming codes, Bose-Chaudhuri-Hocquenghem (BCH) codes, Reed Solomon codes, or any other suitable code types. When data is read and latched by data latches 438, syndrome generator 450 generates an ECC syndrome using the applied coding techniques.

In various embodiments of the invention, the ECC syndrome may be utilized in multiple ways. For example, in some embodiments, the ECC syndrome is supplied to ECC corrector 460 which attempts to correct any errors in the data. Also for example, in some embodiments, the ECC syndrome is supplied to output buffer 452 so that it can be read by an external device. This circuitry supplies the functionality shown in FIGS. 2 and 3, where the ECC syndrome from within a memory device is read by a device external to the memory device.

Memory device 400 also includes command interpreter 414, timing control circuit 424, reference sources 430, reference selector 440, data selection logic 444, refresh address list 480, and microcontroller and/or configuration registers 470. In operation, command interpreter 414 accepts commands and control signals on nodes 403 and 405. In some embodiments, command interpreter 414 includes a state machine that performs sequential operations in response to commands received. In other embodiments, command interpreter 414 includes registers and combinational logic that interprets commands and forwards them to other functional blocks as appropriate.

Microcontroller and/or configuration registers 470 provides control and/or configuration to refresh address list 480, timing control circuit 424, reference selector 440, data selection logic 444, ECC corrector 460, and other functional blocks. In some embodiments, block 470 includes a microcontroller that executes firmware in response to commands forwarded by command interpreter 414. In other embodiments, block 470 does not include a microcontroller, and instead includes registers that hold configuration information for the various functional blocks shown in FIG. 4.

Timing control circuit 424 controls the timing of signals used by sensing circuitry 434. For example, in some embodiments, sensing circuitry 434 may include sense amplifiers that compare a voltage or current received from memory array 410 on node 411 with a voltage or current received from reference selector 440. This comparison is performed for a finite period of time before data latches 438 latch the results (1 or 0). This comparison time is referred to herein as the "read window time". Timing control circuitry 424 includes circuitry to modify the read window time. The read window time may be made shorter or longer. In some embodiments, the read window time may be modified for a single read operation, or may be modified permanently (or until modified again). In some embodiments, the read window time may be modified directly by command interpreter 414 when a command is received, and in other embodiments, the read window time may be modified under program control by microcontroller 470 when executing firmware specified by a command received from command interpreter 414.

Reference sources 430 includes multiple voltage, current, or timing sources, and reference selector 440 selects an output from one of the multiple voltage, current, or timing sources as a reference to be supplied to sensing circuitry 434 on node 441. Reference sources 430 may provide any number of reference outputs and they may have any relationship to each other. For example, in some embodiments, reference sources 430 may output five voltage values having a linear relationship with each other, such as $(-2\alpha V, -\alpha V, V, \alpha V, 2\alpha V)$, where V is a nominal reference voltage, and $\alpha$ is a small delta value. In these embodiments, reference selector 440 selects one of the voltages in the set $(-2\alpha V, -\alpha V, V, \alpha V, 2\alpha V)$ to be used as the reference voltage on node 441. In other embodiments, reference sources 430 may output voltage values having a nonlinear relationship with each other.

In still further embodiments, reference sources 430 may output current values having linear or nonlinear relationships with each other. For example, in some embodiments, reference sources 430 may output five current values having a linear relationship with each other, such as $(-2\alpha I, -\alpha I, I, \alpha I, 2\alpha I)$, where I is a nominal reference current, and $\alpha$ is a small delta value. In these embodiments, reference selector 440 selects one of the currents in the set $(-2\alpha I, -\alpha I, I, \alpha I, 2\alpha I)$ to be used as the reference current on node 441.

Reference selector 440 selects a reference in response to commands received by command interpreter 414. In some embodiments, reference selector 440 selects a reference as commanded directly by command interpreter 414, and in other embodiments, reference selector 440 selects a reference as commanded by microcontroller 470.

In some embodiments, reference sources 430 and reference selector 440 may also be used to compensate for the phenomenon of "floating gate coupling" caused by the programming of nearby FLASH memory locations. In the event that a large percentage of binary 1's have been programmed near the memory location at which a codeword is stored, the gate voltage for each binary 1 and 0 of the codeword experiences an increase. Accordingly, reference selector 440 may select a higher voltage reference, such as $\alpha V$ or perhaps $2\alpha V$, to accommodate the increased voltages present at each gate of the codeword.

Thus, in the embodiments of FIG. 4, requested codewords may be read from memory array 410 using two or more voltage references which determine the value of each binary digit of the codeword. For each codeword, a syndrome can be calculated, and the codeword producing the minimum syndrome may then be selected by data selection logic 444 for output by output buffer 452. Consequently, the probability of an error free codeword being presented at output buffer 452 is significantly increased.

Data selection logic 444 provides data selection signals to data latches 438, and output buffer 452. For example, data selection logic 444 may enable outputs of data latches 438 such that data latches 438 can provide latched data to syndrome generator 450, ECC corrector 460, and microcontroller and/or configuration registers 470. Also for example, data selection logic 444 may enable input latching or output enabling of output buffer 452 to select any of uncorrected data, corrected data, or ECC syndrome to be read from memory device 400.

Data selection logic 444 provides data selection signals in response to commands received by command interpreter 414. In some embodiments, data selection logic 444 provides data selection signals as commanded directly by command interpreter 414, and in other embodiments, data selection logic 444 provides data selection signals as commanded by microcontroller 470.

When the values of the binary digits that constitute a codeword are determined to be erroneous, or at least suspected to be erroneous, the codeword may be corrected and refreshed, or corrected and relocated to an alternate memory location. In this event, the address of the codeword may be stored in refresh address list 480. At an appropriate time, the binary digits of the codeword may be refreshed so that a corrected value of the codeword is present in memory. To bring about the refresh process, a write enable input is asserted, thereby allowing refresh circuitry (not shown in FIG. 4) to write the corrected values of the codeword to memory. In the event that one or more codewords from the same memory module include erroneous and perhaps uncorrectable information, controller 470 may identify the module as being degraded and may choose to relocate the data in a different physical memory location.

Figure 5:
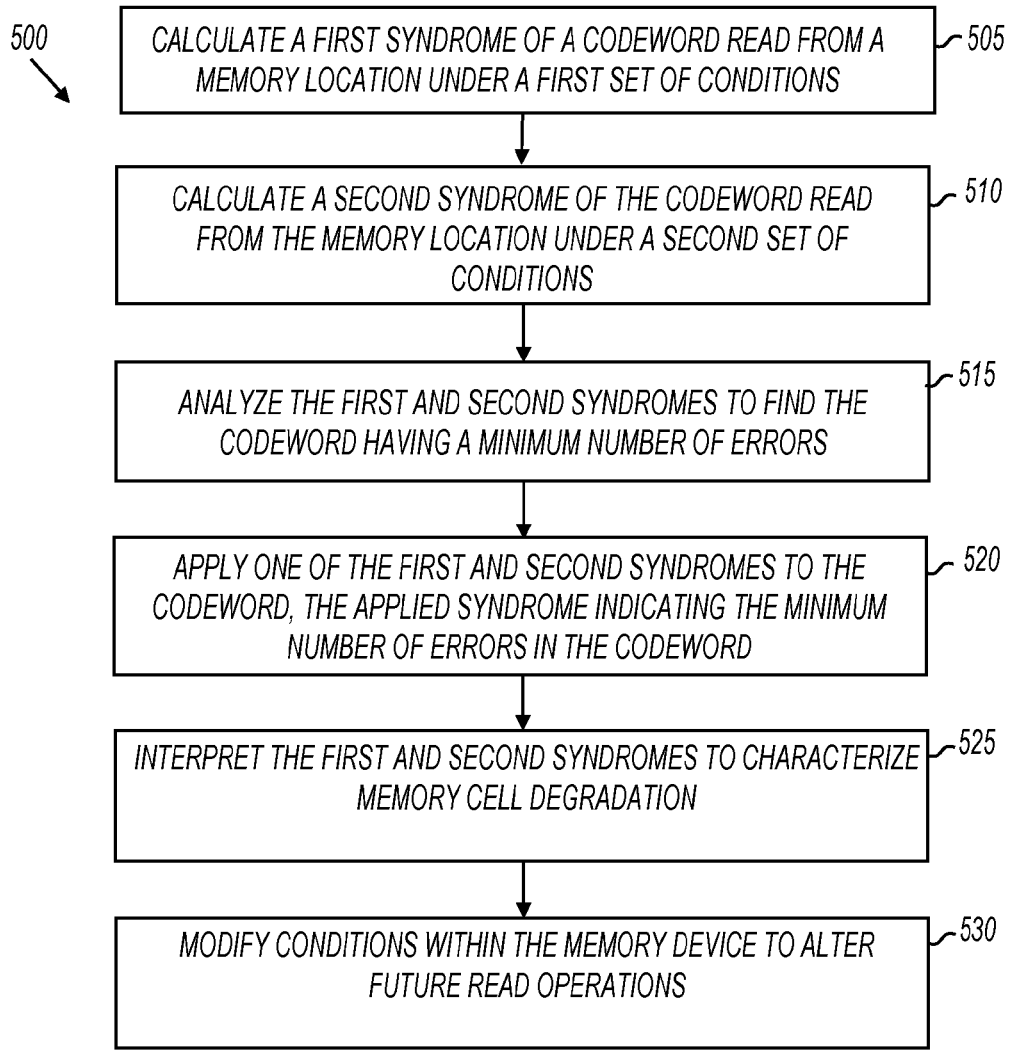
FIGS. 5-12 show flow diagrams for methods of error control in memory storage systems in accordance with various embodiments of the invention.

FIG. 5 shows a flow diagram 500 for a method of error control in memory storage systems in accordance with various embodiments of the invention. Method 500 may be performed by a memory device, a microcontroller in a memory device, a memory controller coupled to one or more devices, or the like. The various embodiments of method 500 are not limited by the type of apparatus performing the method, nor are the embodiments of method 500 limited by the location within a system of an apparatus performing the method. The actions within method 500 may be performed in the order presented, or may be performed in a different order. Further, one or more actions shown in FIG. 5 may be omitted from method 500 without departing from the scope of the present invention.

Method 500 begins at 505, which includes calculating a first syndrome of a codeword read from a memory location under a first set of conditions. In some embodiments, the syndrome may be calculated by a syndrome generator in a memory device, such as syndrome generator 450 (FIG. 4). In other embodiments, the syndrome may be calculated by a processor external to a memory device (e.g., processor 210; FIG. 2).

The conditions referred to in 505 may be any of the conditions that may be programmed or set in a memory device (e.g., memory device 400). In some embodiments of 505, the first set of conditions may include using a first voltage reference to determine logic states of each binary digit of the codeword. For example, referring back to FIG. 4, the first set of conditions may include selecting one of reference sources 430. The reference may be selected by a command received by command interpreter 414 or may be selected using a register or microcontroller in block 470. In other embodiments of 505, the first set of conditions may include using a first read window time when determining logic states of each binary digit of the codeword. For example, the first set of conditions may include commanding timing control circuit 424 to set a particular read window time. The read window time may be set by a command received by command interpreter 414 or may be set using a register or microcontroller in block 470.

The method continues at 510, which includes calculating a second syndrome of the codeword read from the memory location under a second set of conditions. In some embodiments, the second set of conditions includes a second reference value and/or a second read window time. In general, any condition within the memory device may be changed in 510.

The method continues at 515, which includes analyzing the first and second syndromes to find the codeword having a lesser number of errors, and applying one of the first and second syndromes to the codeword at 520. In some embodiments, the syndrome applied corresponds to the codeword that indicates the lesser number of errors. Accordingly, a corrected value for the codeword can be generated using the syndrome that indicates the minimum number of errors.

At 525, the first and second syndromes are interpreted to characterize memory cell degradation. For example, the first syndrome may indicate an error in a particular memory cell, whereas the second syndrome may indicate no error. When this occurs, the memory cell degradation may be related to the conditions that were changed between calculating the two syndrome values.

At 530, conditions within the memory device are modified to alter future read operations from the memory location. For example, if errors were reduced by selecting a different reference, this reference may be set for future read operations. Also for example, if errors were reduced by setting a longer read window time, then the read window time may be modified for future reads as well.

Figure 6:
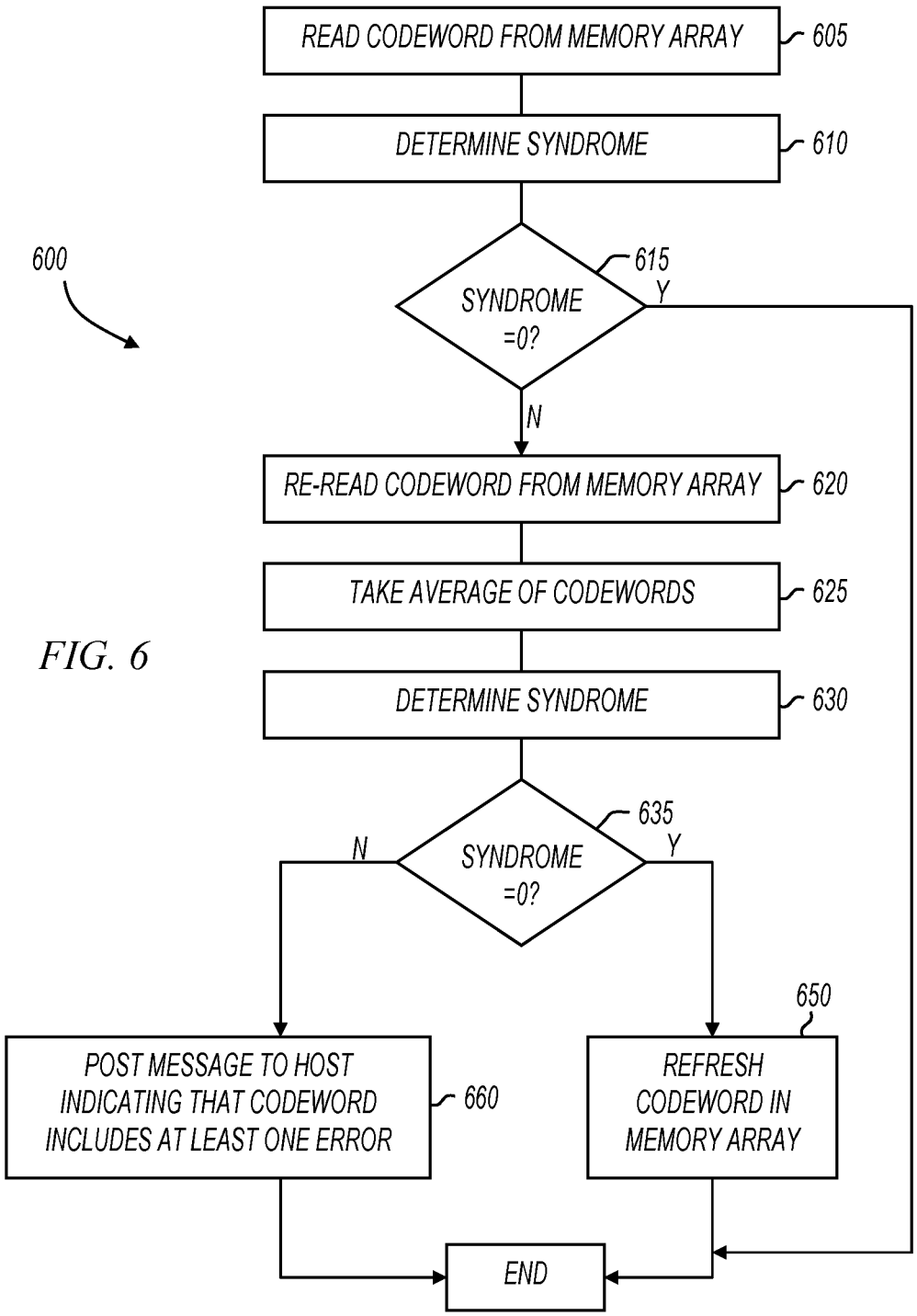

FIG. 6 shows a flow diagram for read averaging. Although the embodiments of FIGS. 1, 2, and 4 are suitable for performing the method of FIG. 6, nothing prevents performing the method using alternative arrangements of hardware and/or software. The method of FIG. 6 begins at 605, which includes reading a codeword from a location in a memory array. The method continues at 610 in which the syndrome of the codeword is determined. At 615, a decision is made resulting from the value of the syndrome. In the event that the syndrome equals 0, indicating that the codeword read in 605 is error free, the method comes to an end.

In the event that the syndrome does not equal 0, 620 is performed in which the codeword is re-read from the memory array. In some embodiments, the codeword is re-read multiple times at 620. At 625, the codewords are averaged, and at 630, the syndrome of the averaged codeword is determined.

At 635, a decision is made resulting from the value of the syndrome of the averaged codeword. In the event that the syndrome of the averaged codeword is equal to 0, 650 is performed in which the codeword is refreshed in the memory array. In the event that the syndrome is not equal to zero, 660 is performed in which a message is posted indicating that the codeword includes at least one error. The method ends after the completion of either 660 or 650.

In some embodiments, method 600 is performed within a memory device without outside intervention. For example, controller 470 (FIG. 4) may perform the actions of method 600 by executing software or firmware within memory device 400. In these embodiments, controller 470 may effect multiple codeword reads from the memory array, and may perform the averaging. Controller 470 may further interpret syndrome values generated by syndrome generator 450, and take actions as shown in FIG. 6.

In other embodiments, method 600 is performed by a processor and memory device in combination. For example, a processor such as processor 210 (FIG. 2) may send commands to memory device 400 to effect the actions of method 600. Commands from the processor may be received at command interpreter 414 which causes multiple codeword reads. The processor reads syndrome values through output buffer 452, and makes decisions accordingly.

Figure 7:
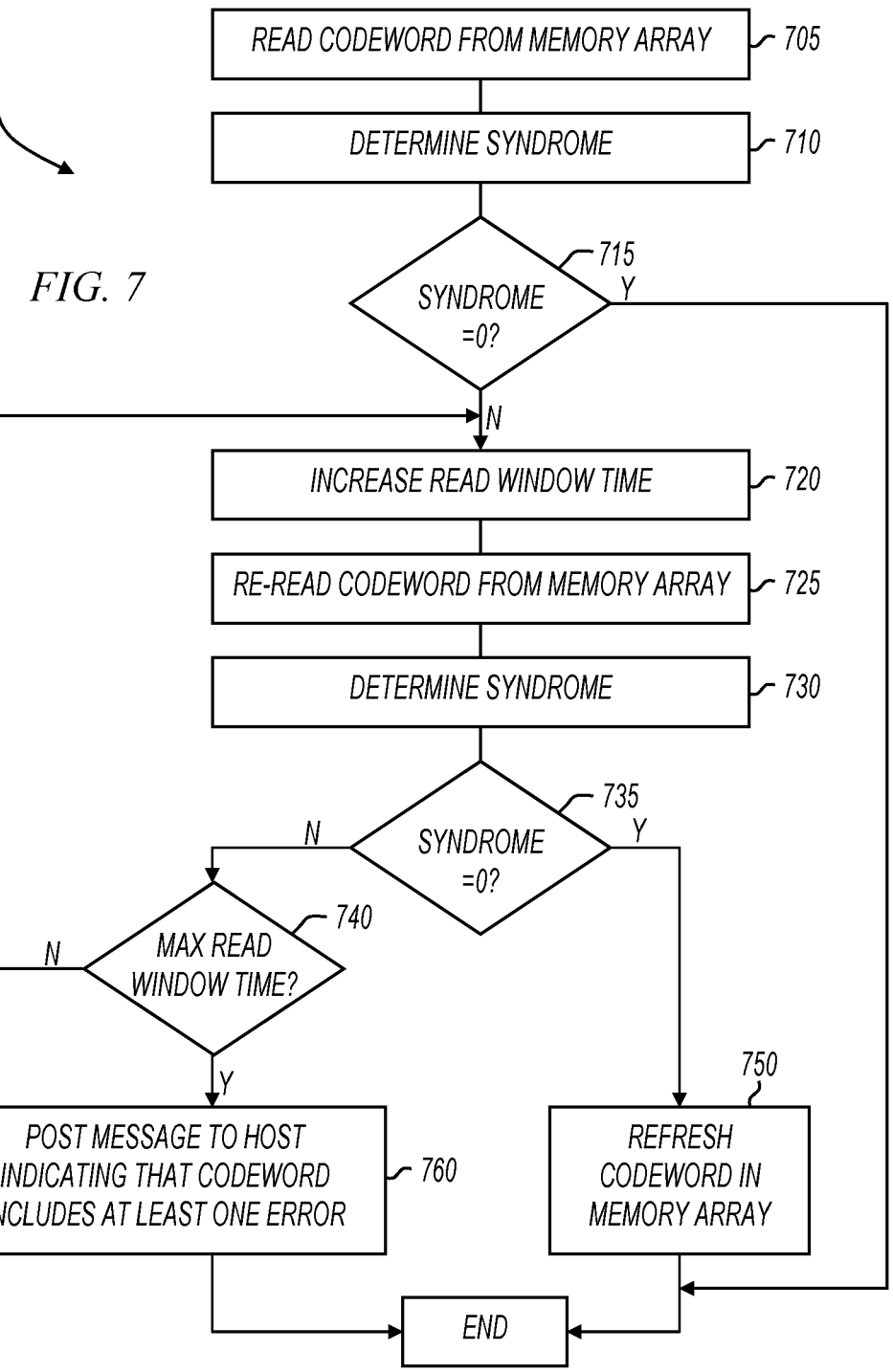

FIG. 7 shows a flow diagram 700 for a method of error control in memory storage systems in accordance with various embodiments of the invention. Although the embodiments of FIGS. 1, 2, and 4 are suitable for performing the method of FIG. 7, nothing prevents performing the method using alternative arrangements of hardware and/or software. The method of FIG. 7 begins at 705, which includes reading a codeword from a location in a memory array. In 705, the reading operation is performed using a nominal read window time. The method continues at 710 in which the syndrome of the codeword is determined. At 715, a decision is made resulting from the value of the syndrome. In the event that the syndrome equals 0, indicating that the codeword read in 705 is error free, the method comes to an end.

In the event that the syndrome does not equal 0, 720 is performed in which the read window time is increased. In some embodiments, this is accomplished by commanding timing control circuit 424 (FIG. 4) to allow more time for sensing circuitry 434 to sense the values of the codeword. At 725, the codeword is re-read using the increased read window time. As previously mentioned, the use of an increased window time may cause one or more binary digits that constitute the codeword to be interpreted differently by level sensing circuitry. At 730, the syndrome of the re-read codeword is determined. At 735, a decision is made resulting from the value of the syndrome determined 720. In the event that the syndrome of the re-read codeword is equal to 0, 750 is performed in which the codeword is refreshed in the memory array. In the event that the syndrome of the re-read codeword is not equal to 0, 740 is performed in which a determination is made as to whether the maximum read time window has been reached. If the maximum read time window has not been reached, control is passed to 720 to further increase the read window time. If the maximum read window time has been reached, 760 is performed in which a message is posted indicating that the codeword includes at least one error. The method ends after the completion of either 760 or 750.

In some embodiments, method 700 is performed within a memory device without outside intervention. For example, controller 470 (FIG. 4) may perform the actions of method 700 by executing software or firmware within memory device 400. In these embodiments, controller 470 may command timing control circuit 424 modify read window times to be used by sensing circuitry 434. Controller 470 may further interpret syndrome values generated by syndrome generator 450, and take actions as shown in FIG. 7.

In other embodiments, method 700 is performed by a processor and memory device in combination. For example, a processor such as processor 210 (FIG. 2) may send commands to memory device 400 to effect the actions of method 700. Commands from the processor may be received at command interpreter 414 which causes timing control circuit 424 to modify read window times. The processor reads syndrome values through output buffer 452, and makes decisions accordingly.

Figure 8:
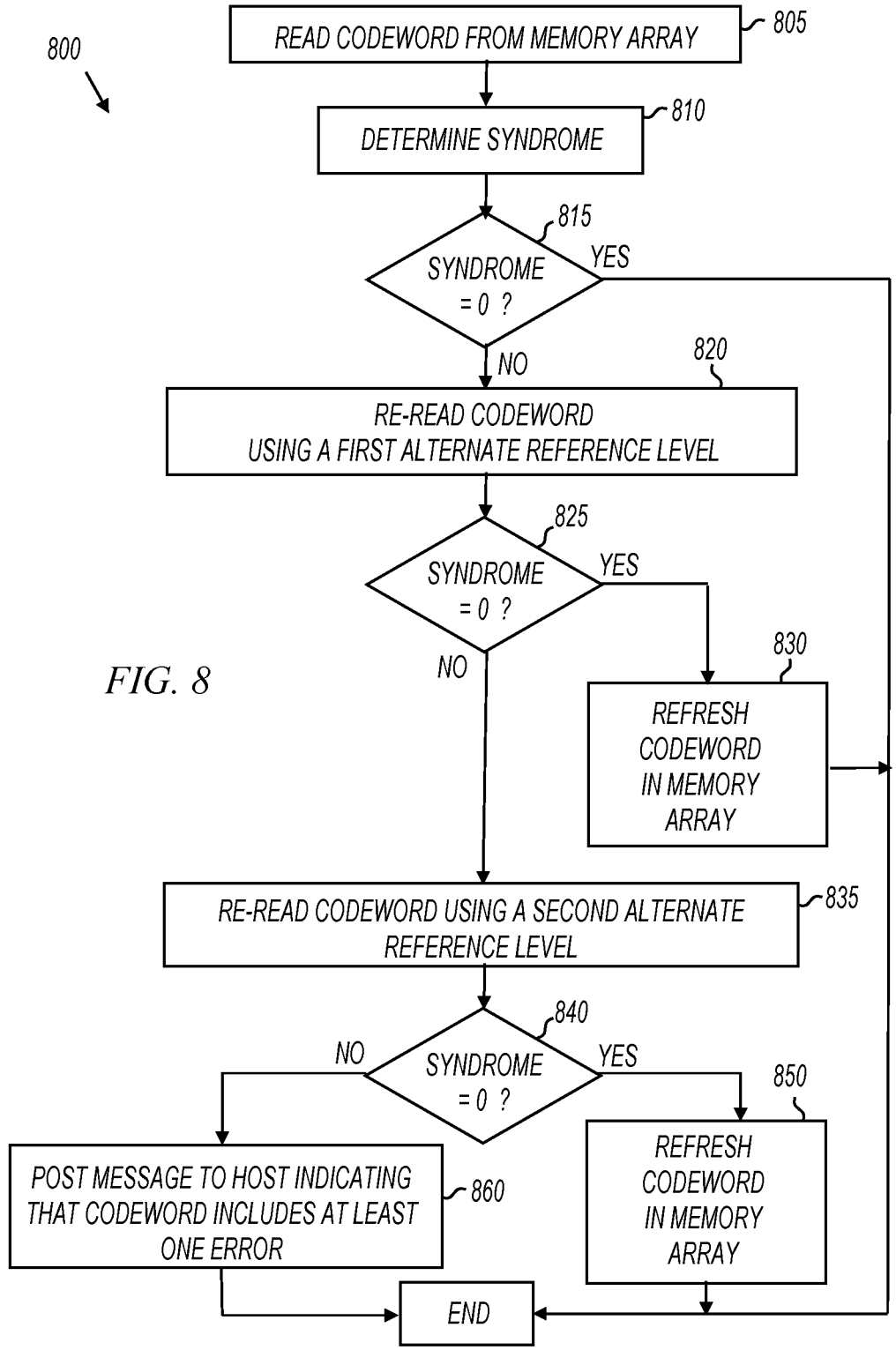

FIG. 8 shows flow diagram 800 for a method of error control in memory storage systems in accordance with various embodiments of the invention. Although the embodiments of FIGS. 1, 2, and 4 are suitable for performing the method of FIG. 8, nothing prevents performing the method using alternative arrangements of hardware and/or software. The method of FIG. 8 begins at 805, which includes reading a codeword from a location in a memory array. In 805, the reading operation is performed using a first voltage reference as an input to logic state sensing circuitry, such as sensing circuitry 434 of FIG. 4. The method continues at 810 in which the syndrome of the codeword is determined. At 815, a decision is made resulting from the value of the syndrome. In the event that the syndrome equals 0, indicating that the codeword read in 805 is error free, the method comes to an end.

In the event that the syndrome does not equal 0, 820 is performed in which the codeword is re-read using a first alternate voltage reference level. As previously mentioned, the use of an alternate voltage reference level may cause one or more binary digits that constitute the codeword to be interpreted differently by level sensing circuitry. At 825, a decision is made resulting from the value of the syndrome re-read in 820. In the event that the syndrome of the re-read codeword is equal to 0, 830 is performed in which the codeword is refreshed in the memory array. In the event that the syndrome of the re-read codeword is not equal to 0, 835 is performed in which the codeword is re-read using a second alternate voltage reference level.

At 840 a decision is made resulting from the value of the syndrome for the codeword re-read in 835. If the re-reading operation of 835 results in codeword having a syndrome equal to 0, 850 is performed in which the codeword is refreshed in the memory array. In the event that the syndrome is not equal to zero, 860 is performed in which a message is posted indicating that the codeword includes at least one error. The method ends after the completion of either 860 or 850.

In some embodiments, method 800 is performed within a memory device without outside intervention. For example, controller 470 (FIG. 4) may perform the actions of method 800 by executing software or firmware within memory device 400. In these embodiments, controller 470 may command reference selector 440 to modify references to be used by sensing circuitry 434. Controller 470 may further interpret syndrome values generated by syndrome generator 450, and take actions as shown in FIG. 8.

In other embodiments, method 800 is performed by a processor and memory device in combination. For example, a processor such as processor 210 (FIG. 2) may send commands to memory device 400 to effect the actions of method 800. Commands from the processor may be received at command interpreter 414 which causes reference selector 440 to select different reference values. The processor reads syndrome values through output buffer 452, and makes decisions accordingly.

Figure 9:
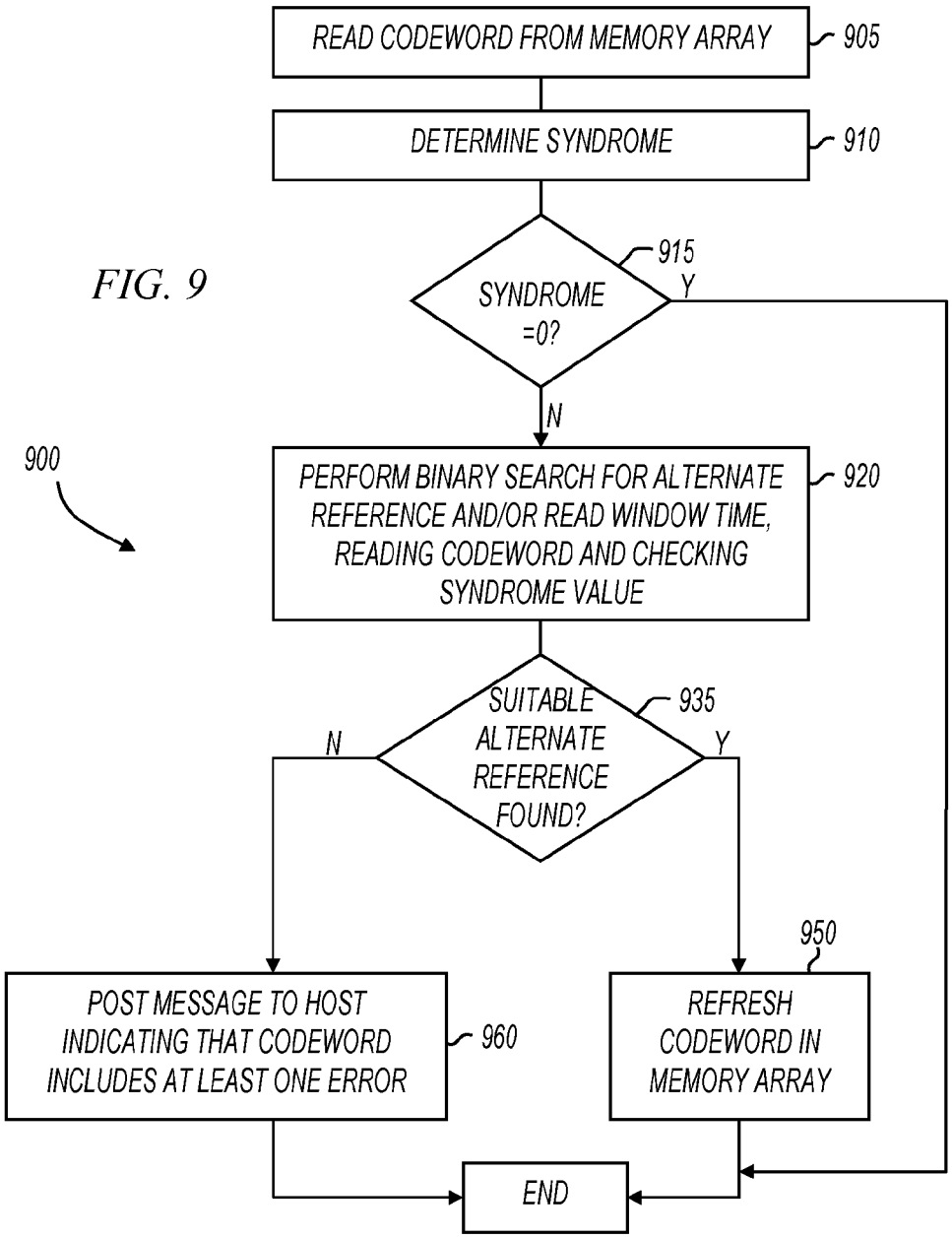

FIG. 9 shows a flow diagram of a method for determining alternate reference values and/or read window times. Although the embodiments of FIGS. 1, 2, and 4 are suitable for performing the method of FIG. 9, nothing prevents performing the method using alternative arrangements of hardware and/or software. The method of FIG. 9 begins at 905, which includes reading a codeword from a location in a memory array. In 905, the reading operation is performed using a nominal read window time and a first voltage reference as an input to logic state sensing circuitry, such as sensing circuitry 434 of FIG. 4. The method continues at 910 in which the syndrome of the codeword is determined. At 915, a decision is made resulting from the value of the syndrome. In the event that the syndrome equals 0, indicating that the codeword read in 905 is error free, the method comes to an end.

In the event that the syndrome does not equal 0, 920 is performed in which a search for an alternate reference and/or read window time is performed. The actions of 920 may include a binary search for an alternate reference. The binary search may continuously modify the reference, re-read the codeword, determine the syndrome, and check for a zero syndrome value. Likewise, the binary search may continuously modify the read window time, re-read the codeword, determine the syndrome, and check for a zero syndrome value.

At 935 a decision is made whether a suitable alternate reference and/or read window time has been found. A suitable alternate reference and/or read window time may be one that results in a zero syndrome or a syndrome that reflects correctable errors in the codeword. If a suitable alternate reference and/or read window time has been found, 950 is performed in which the codeword is refreshed in the memory array. In the event that a suitable alternate reference and/or read window time has not been found, 960 is performed in which a message is posted indicating that the codeword includes at least one error. The method ends after the completion of either 960 or 950.

In some embodiments, method 900 is performed within a memory device without outside intervention. For example, controller 470 (FIG. 4) may perform the actions of method 900 by executing software or firmware within memory device 400. In these embodiments, controller 470 may command reference selector 440 to modify references to be used by sensing circuitry 434. Controller 470 may further interpret syndrome values generated by syndrome generator 450, and take actions as shown in FIG. 9.

In other embodiments, method 900 is performed by a processor and memory device in combination. For example, a processor such as processor 210 (FIG. 2) may send commands to memory device 400 to effect the actions of method 900. Commands from the processor may be received at command interpreter 414 which causes reference selector 440 to select different reference values. The processor reads syndrome values through output buffer 452, and makes decisions accordingly.

Figure 10:
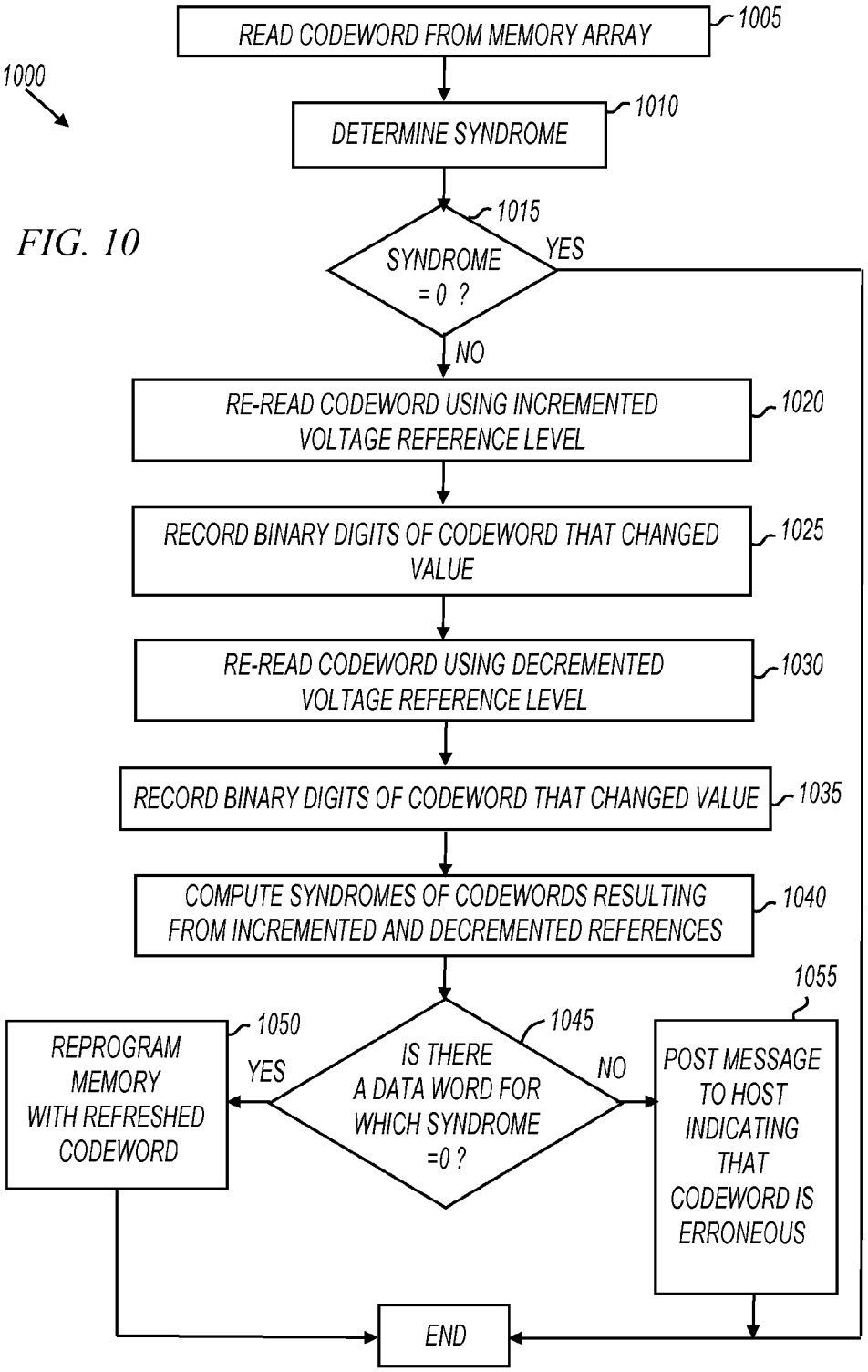

FIG. 10 shows flow diagram 1000 for a method of error control in memory storage systems in accordance with various embodiments of the invention. Although the embodiments of FIGS. 1, 2, and 4 are suitable for performing the method of FIG. 10, nothing prevents performing the method using alternative arrangements of hardware and/or software. The method of FIG. 10 begins at 1005, which includes reading a codeword from a location in a memory array. In 1005, the reading operation is performed using a first voltage reference as an input to sensing circuitry, such as sensing circuitry 434 of FIG. 4, which senses the logic state of the binary 1s and 0s that constitute each codeword. The method continues at 1010 in which the syndrome of the codeword read in 1005 is determined. At 1015, a decision is made based on the value of the syndrome. In the event that the syndrome equals 0, the method comes to an end. In the event that the syndrome equals a value other than 0, 1020 is performed in which the codeword is re-read using an incremented voltage reference level. In 1020, an increment may correspond to a predetermined value that represents a deviation from a standard voltage reference value, such as described in the discussion of FIG. 4.

At 1025, the binary digits of the codeword that changed value during the re-reading in 1020 are recorded. In some embodiments of the invention, these binary digits represent weak or marginal portions of the codeword. In these embodiments, it may be useful to maintain a record of these codewords, perhaps by way of a refresh address list, such as address list 480 described in FIG. 4.

At 1030, the codeword may be re-read using a decremented voltage reference level, such as a $-1\alpha$. At 1035, the binary digits of the codeword that changed value during the re-reading operation of 1030 are recorded. As previously mentioned, these binary digits may represent weak or marginal portions of the codeword. At 1040, the syndromes resulting from reading the codeword using the incremented (at 1020) and decremented (at 1030) voltage references are computed. The method proceeds to 1045, in which a decision is made resulting from the value of the syndromes computed in 1040. In the event that a syndrome has been found that is equal to 0, 1050 is performed in which the memory location storing the codeword is refreshed using the codeword that produced the syndrome of 0. In the event that a syndrome equal to 0 has not been found, 1055 is performed in which a message is posted indicating that the codeword includes erroneous or uncorrectable binary digits. The method ends after the completion of 1050 or 1055.

In some embodiments, method 1000 is performed within a memory device without outside intervention. For example, controller 470 (FIG. 4) may perform the actions of method 1000 by executing software or firmware within memory device 400. In these embodiments, controller 470 may command reference selector 440 to modify references to be used by sensing circuitry 434. Controller 470 may further interpret syndrome values generated by syndrome generator 450, and take actions as shown in FIG. 10.

In other embodiments, method 1000 is performed by a processor and memory device in combination. For example, a processor such as processor 210 (FIG. 2) may send commands to memory device 400 to effect the actions of method 1000. Commands from the processor may be received at command interpreter 414 which causes reference selector 440 to select different reference values. The processor reads syndrome values through output buffer 452, and makes decisions accordingly.

Figure 11:
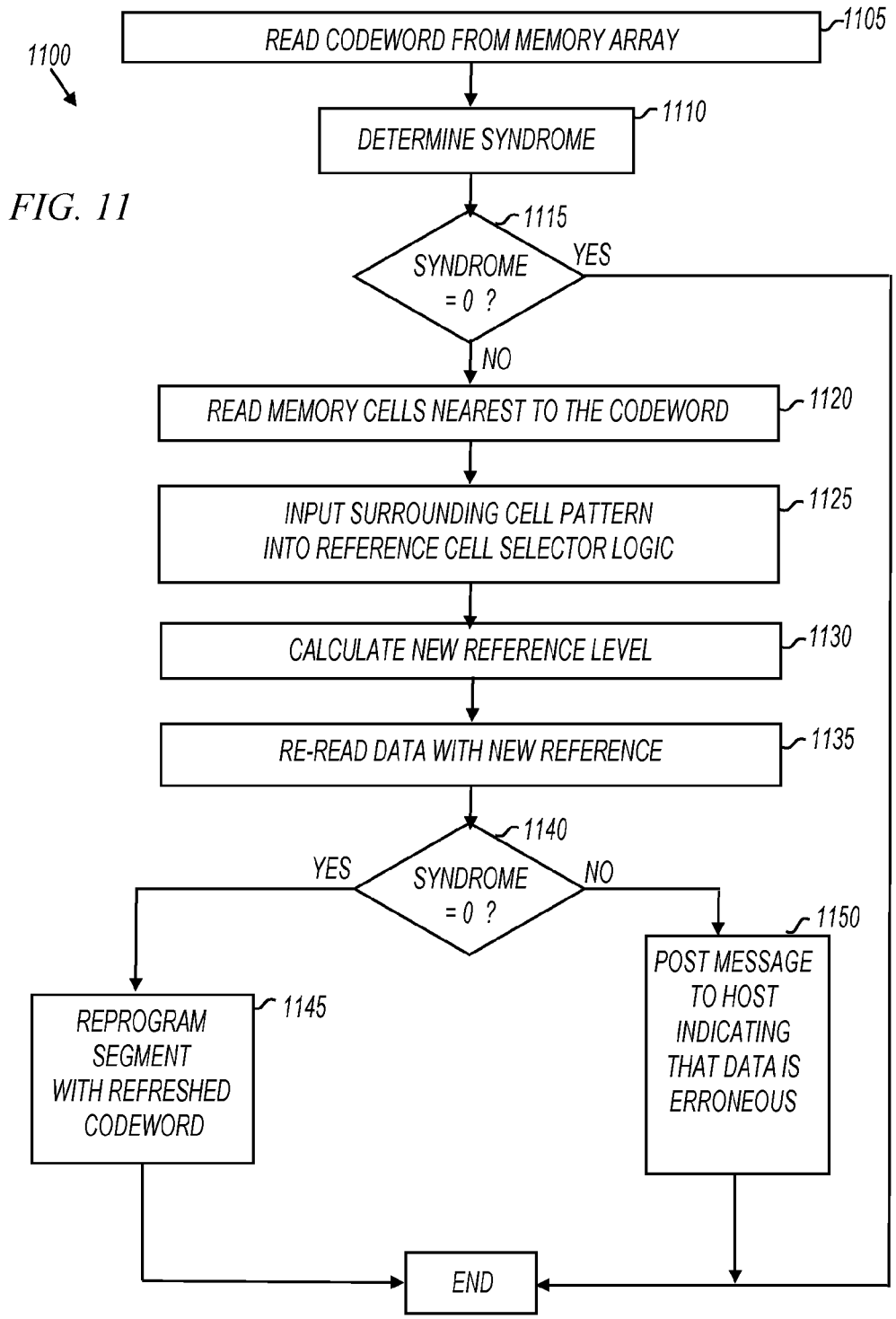

FIG. 11 shows flow diagram 1100 for a method of error control in memory storage systems in accordance with various embodiments of the invention. Although the embodiments of FIGS. 1, 2, and 4 are suitable for performing the method of FIG. 11, nothing prevents performing the method using alternative arrangements of hardware and/or software. The method of FIG. 11 begins at 1105, which includes reading a codeword from a location in a memory array. In 1105, the reading operation is performed using a first voltage reference as an input to circuitry that senses the logic state of the binary 1s and 0s that constitute each codeword, such as sensing circuitry 424 of FIG. 4. The method continues at 1110 in which the syndrome of the codeword read in 1105 is determined. At 1115, a decision is made resulting from the value of the syndrome. In the event that a syndrome equals 0, the method comes to an end.

In the event that the syndrome determined in 1110 equals a value other than 0, 1120 is performed which includes reading the contents of memory locations nearest to the codeword. As previously mentioned, in the event that a large percentage of binary 1's have been programmed at surrounding locations nearby the codeword, the phenomenon of "floating gate coupling" may cause the voltage for each binary 1 and 0 of the particular codeword to experience an increase. In the event that only a small percentage of binary 1's have been programmed at surrounding locations nearby the codeword, the voltage for each binary 1 and 0 of the particular codeword would likely experience a smaller increase. Thus, at 1125, the surrounding memory cell pattern is input to a logic module which calculates an expected increase in the voltage corresponding to the binary values of the codeword based on the pattern.

In some embodiments of the invention, the logic module used at 1125 exists within microcontroller/configuration registers 470 described in FIG. 4. In other embodiments, the logic module exists within software or within a processor such as processor 210 (FIG. 2). However, in either event, 1130 is performed in which a new voltage reference level is calculated. At 1135, the codeword is re-read using the voltage reference level calculated in 1130. The method continues at 1140 in which a decision based on the syndrome of the codeword re-read in 1135 is performed. In the event that the codeword re-read at 1135 results in a syndrome equal to 0, 1145 is performed in which the codeword is refreshed. In the event that the calculated syndrome is not equal to 0, 1150 is performed in which a message is posted indicating that the codeword is erroneous or uncorrectable. The method concludes after either 1145 or 1150 is performed.

In some embodiments, method 1100 is performed within a memory device without outside intervention. For example, controller 470 (FIG. 4) may perform the actions of method 1100 by executing software or firmware within memory device 400. In these embodiments, controller 470 may command reference selector 440 to modify references to be used by sensing circuitry 434. Controller 470 may further interpret syndrome values generated by syndrome generator 450, and take actions as shown in FIG. 11.

In other embodiments, method 1100 is performed by a processor and memory device in combination. For example, a processor such as processor 210 (FIG. 2) may send commands to memory device 400 to effect the actions of method 1100. Commands from the processor may be received at command interpreter 414 which causes reference selector 440 to select different reference values. The processor reads syndrome values through output buffer 452, and makes decisions accordingly.

Figure 12:
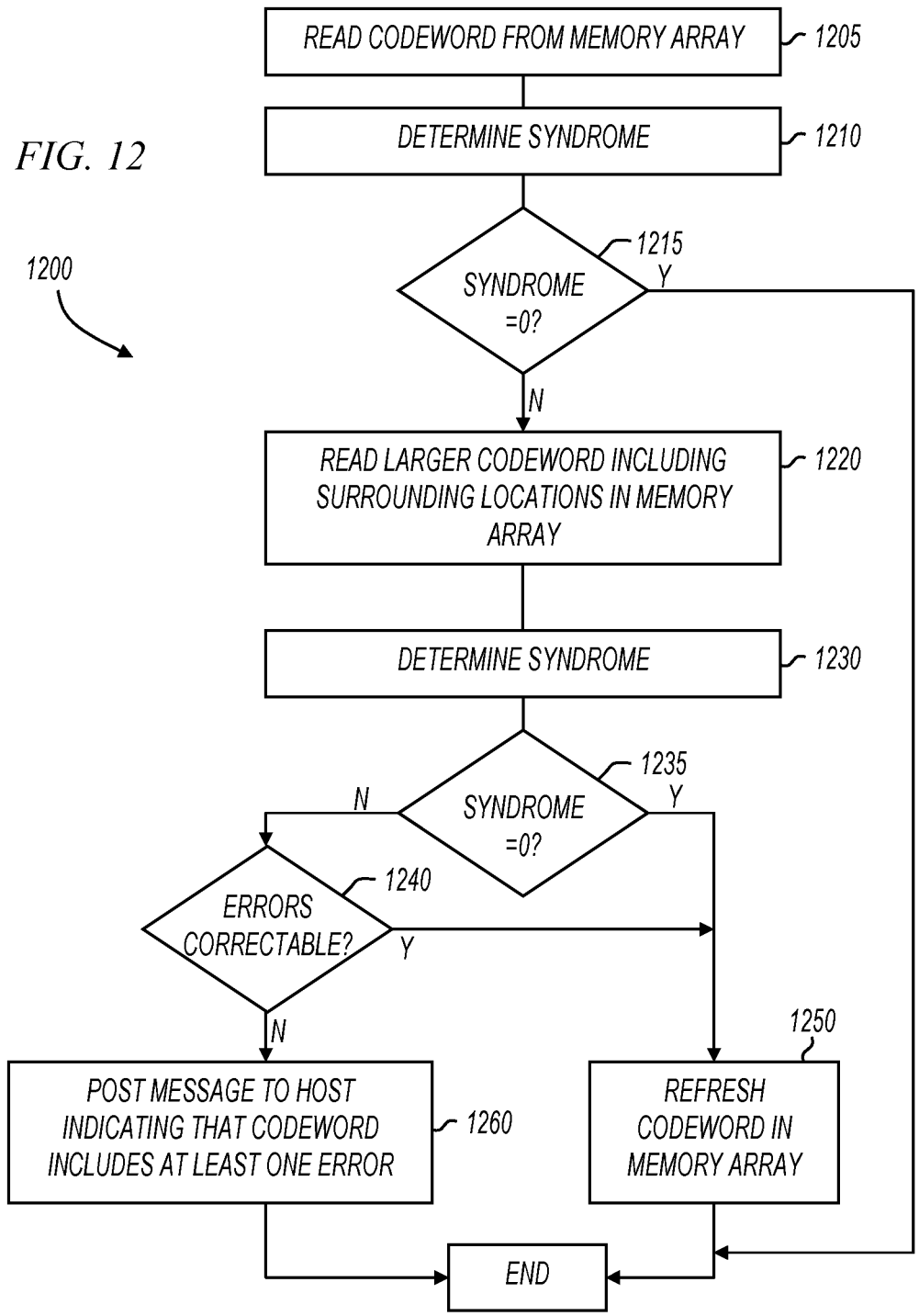

FIG. 12 shows flow diagram 1200 for a method of error control in memory storage systems in accordance with various embodiments of the invention. Although the embodiments of FIGS. 1, 2, and 4 are suitable for performing the method of FIG. 12, nothing prevents performing the method using alternative arrangements of hardware and/or software. The method of FIG. 12 begins at 1205, which includes reading a codeword from a location in a memory array. The method continues at 1210 in which the syndrome of the codeword is determined. At 1215, a decision is made resulting from the value of the syndrome. In the event that the syndrome equals 0, indicating that the codeword read in 1205 is error free, the method comes to an end.

In the event that the syndrome does not equal 0, 1220 is performed in which a larger codeword is read from the memory array. The larger codeword includes the original codeword read at 1205 along with additional data stored in the memory array. At 1230, the syndrome of the larger codeword is determined. By including more data in the larger codeword, the probability of correcting errors in the codeword increase.

At 1235 a decision is made resulting from the value of the syndrome for the larger codeword read in 1220. If the reading operation of 1220 results in codeword having a syndrome equal to 0, 1250 is performed in which the codeword is refreshed in the memory array. In the event that the syndrome is not equal to zero, 1240 is performed in which a determination is made whether any errors found are correctable. If the errors are correctable, then they are corrected and the codeword is refreshed at 1250. If errors are not correctable, then 1260 is performed in which a message is posted indicating that the codeword includes at least one error. The method ends after the completion of either 1260 or 1250.

In some embodiments, method 1200 is performed within a memory device without outside intervention. For example, controller 470 (FIG. 4) may perform the actions of method 1200 by executing software or firmware within memory device 400. In these embodiments, controller 470 may command a larger codeword to be read. Controller 470 may further interpret syndrome values generated by syndrome generator 450, and take actions as shown in FIG. 12.

In other embodiments, method 1200 is performed by a processor and memory device in combination. For example, a processor such as processor 210 (FIG. 2) may send commands to memory device 400 to effect the actions of method 1200. Commands from the processor may be received at command interpreter 414 which causes reference selector 440 to select different reference values. The processor reads syndrome values through output buffer 452, and makes decisions accordingly.

In conclusion, although the present invention has been described in conjunction with certain embodiments, it is to be understood that modifications and variations may be resorted to without departing from the scope of the invention as those skilled in the art readily understand. Such modifications and variations are considered be within the scope of the invention and the appended claims.

What is claimed is:

1. A method comprising:
   calculating a first syndrome of a codeword read from a memory under a first set of conditions;
   calculating a second syndrome of the codeword read from the memory under a second set of conditions;
   analyzing the first and second syndromes to find the codeword having a minimum number of errors;
   applying one of the first and second syndromes to the codeword, the applied syndrome indicating the minimum number of errors in the codeword; and
   interpreting the first and second syndromes to characterize memory cell degradation.

2. The method of claim 1 wherein the first set of conditions includes a first voltage reference used to determine logic states of each binary digit of the codeword and wherein the second set of conditions includes a second voltage reference used to determine the logic states of each binary digit of the codeword.

3. The method of claim 2 further comprising searching, by way of a binary search, for the second voltage reference.

4. The method of claim 1 further comprising generating a corrected value of the codeword using the syndrome that indicates the minimum number of errors.

5. The method of claim 4 further comprising storing the corrected value of the codeword in the memory.

6. The method of claim 1 further comprising identifying at least one memory device that contributes to errors identified in at least one of the first and second syndromes.

7. The method of claim 1 wherein the first set of conditions includes a first read window time used to determine logic states of each binary digit of the codeword and wherein the second set of conditions includes a second read window time used to determine the logic states of each binary digit of the codeword.

8. The method of claim 1, further comprising; reading memory cells nearest to the storage location of the codeword; and
 determining a reference level based on a surrounding cell pattern from the memory cells nearest to the storage location of the codeword.

9. The method of claim 1, further comprising;
 determining that a larger number of errors are present in the codeword than can be corrected by the applied syndrome; and
 reading a larger codeword from the memory at which the codeword is stored.

10. The method of claim 9, further comprising calculating a syndrome of the larger codeword.

11. The method of claim 1 wherein the method is performed by a controller within a memory device.

12. The method of claim 1 wherein the method is performed by a processor external to the memory device.

13. A memory device comprising:
 a memory array for storing a plurality of codewords;
 sensing circuitry for determining a value for each binary digit of each of the plurality of codewords; and
 a syndrome generator to generate syndromes from the plurality of codewords;
 voltage reference selector for selecting voltage reference to be used by the sensing circuitry in determining the state of each binary digit of each of the plurality of codewords; and
 output circuitry coupled to the syndrome generator to make syndromes available to devices outside the memory device.

14. The memory device of claim 13 wherein the voltage reference selector is capable of selecting between at least three voltage references.

15. The memory device of claim 13 further comprising a controller coupled to the syndrome generator to determine if a calculated syndrome is equal to zero, and coupled to the voltage reference selector to select a voltage reference.

16. The memory device of claim 13 wherein the output circuitry is coupled to the sensing circuitry to provide an output path for uncorrected codewords.

17. A non-transitory computer-readable medium having instructions stored thereon that when executed by a computer, cause the computer to perform a method that comprises:
 striping a data word across multiple memory devices;
 detecting an error in the data word when reading;
 reading error correction code syndrome values from each of the multiple memory devices;
 determining which of the multiple memory devices is in error; and
 commanding the memory device in error to modify a read window time.

18. The non-transitory computer-readable medium of claim 17 wherein the method further comprises commanding the memory device in error to modify a read window time.

19. The non-transitory computer-readable medium of claim 17 wherein the method further comprises commanding the memory device in error to modify a voltage reference.

20. The non-transitory computer-readable medium of claim 17 wherein the method further comprises commanding the memory device in error to average multiple reads of the data in error.

21. The non-transitory computer-readable medium of claim 17 wherein the method further comprises commanding the memory device to search for an alternate voltage reference value to be used when reading the data in error.

22. The non-transitory computer-readable medium of claim 17 wherein the method further comprises sending a command to the memory device in error to increase the likelihood of reading correct data from the memory device.

23. The non-transitory computer-readable medium of claim 17 wherein the method further comprises relocating data stored in the memory device in error.

24. A non-transitory computer-readable medium having instructions stored thereon that when executed by a computer, cause the computer to comprises:
 striping a data word across multiple memory devices;
 detecting an error in the data word when reading;
 reading error correction code syndrome values from each of the multiple memory devices;
 determining which of the multiple memory devices is in error; and
 commanding the memory device in error to modify a voltage reference.

25. A non-transitory computer-readable medium having instructions stored thereon that when executed by a computer, cause the computer to perform a method that comprises:
 striping a data word across multiple memory devices;
 detecting an error in the data word when reading;
 reading error correction code syndrome values from each of the multiple memory devices;
 determining which of the multiple memory devices is in error; and
 commanding the memory device in error to average multiple reads of the data in error.

26. A non-transitory computer-readable medium having instructions stored thereon that when executed by a computer, cause the computer to perform a method that comprises:
 striping a data word across multiple memory devices;
 detecting an error in the data word when reading;
 reading error correction code syndrome values from each of the multiple memory devices;
 determining which of the multiple memory devices is in error; and
 commanding the memory device to search for an alternate voltage reference value to be used when reading the data in error.

27. A non-transitory computer-readable medium having instructions stored thereon that when executed by a computer, cause the computer to perform a method that comprises:
 striping a data word across multiple memory devices;
 detecting an error in the data word when reading;
 reading error correction code syndrome values from each of the multiple memory devices;
 determining which of the multiple memory devices is in error; and sending a command to the memory device in error to increase the likelihood of reading correct data from the memory device.

\* \* \* \* \*

UNITED STATES PATENT AND TRADEMARK OFFICE
CERTIFICATE OF CORRECTION

| | | |
|---|---|---|
| PATENT NO. | : 8,635,514 B2 | Page 1 of 1 |
| APPLICATION NO. | : 13/037298 | |
| DATED | : January 21, 2014 | |
| INVENTOR(S) | : Christopher Bueb et al. | |

It is certified that error appears in the above-identified patent and that said Letters Patent is hereby corrected as shown below:

In the Claims

In column 17, line 24, in Claim 9, delete "comprising;" and insert -- comprising: --, therefor.

In column 17, line 42, in Claim 13, before "voltage" insert -- a --.

In column 17, line 42, in Claim 13, after "selecting" insert -- a --.

In column 18, line 27, in Claim 24, after "to" insert -- perform a method that --.

Signed and Sealed this
First Day of April, 2014

Michelle K. Lee
*Deputy Director of the United States Patent and Trademark Office*